(12) United States Patent
Evans et al.

(10) Patent No.: US 11,119,405 B2
(45) Date of Patent: *Sep. 14, 2021

(54) TECHNIQUES FOR FORMING ANGLED STRUCTURES

(71) Applicant: APPLIED Materials, Inc., Santa Clara, CA (US)

(72) Inventors: Morgan Evans, Manchester, MA (US); Joseph C. Olson, Beverly, MA (US); Rutger Meyer Timmerman Thijssen, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 167 days.

This patent is subject to a terminal disclaimer.

(21) Appl. No.: 16/159,059

(22) Filed: Oct. 12, 2018

(65) Prior Publication Data

US 2020/0117080 A1   Apr. 16, 2020

(51) Int. Cl.
*G03F 7/09* (2006.01)
*G03F 7/11* (2006.01)
(Continued)

(52) U.S. Cl.
CPC .......... *G03F 1/80* (2013.01); *H01L 21/32131* (2013.01); *G03F 7/70625* (2013.01); *H01L 21/32139* (2013.01)

(58) Field of Classification Search
CPC .......... G03F 1/80; G03F 7/70625; G03F 7/09; H01L 21/32139; H01L 21/0337;
(Continued)

(56) References Cited

U.S. PATENT DOCUMENTS

| 5,116,461 A | * | 5/1992 | Lebby | ................. | G02B 5/1857 |
|---|---|---|---|---|---|
| | | | | | 204/192.34 |
| 5,289,077 A | * | 2/1994 | Ugajin | ................. | H01J 21/105 |
| | | | | | 313/308 |

(Continued)

FOREIGN PATENT DOCUMENTS

| JP | 60-033502 | * | 2/1985 |
|---|---|---|---|
| JP | 60-033504 | * | 2/1985 |

(Continued)

OTHER PUBLICATIONS

Machine translation of JP 01-231327 (1989).*

(Continued)

*Primary Examiner* — Martin J Angebranndt
(74) *Attorney, Agent, or Firm* — Kacvinsky Daisak Bluni PLLC

(57) ABSTRACT

A method of forming angled structures in a substrate. The method may include the operation of forming a mask by etching angled mask features in a mask layer, disposed on a substrate base of the substrate, the angled mask features having sidewalls, oriented at a non-zero angle of inclination with respect to perpendicular to a main surface of the substrate. The method may include etching the substrate with the mask in place, the etching comprising directing ions having trajectories arranged at a non-zero angle of incidence with respect to a perpendicular to the main surface.

15 Claims, 5 Drawing Sheets

(51) Int. Cl.
*H01L 21/3213* (2006.01)
*G03F 1/80* (2012.01)
*G03F 7/20* (2006.01)

(58) Field of Classification Search
CPC ............. H01L 21/3065; H01L 21/3083; H01L 21/3086; H01L 21/32131; G02B 6/0038; G02B 6/12; G02B 5/1857
See application file for complete search history.

(56) References Cited

U.S. PATENT DOCUMENTS

| | | | |
|---|---|---|---|
| 5,376,225 A * | 12/1994 | Wakabayashi | B82Y 10/00 204/192.34 |
| 5,572,564 A * | 11/1996 | Murakami | B82Y 10/00 378/34 |
| 5,712,188 A * | 1/1998 | Chu | H01S 5/18355 438/40 |
| 7,129,475 B2 | 10/2006 | Kanno et al. | |
| 7,455,957 B2 | 11/2008 | Koeda | |
| 8,040,607 B2 | 10/2011 | Miller | |
| 9,075,194 B2 | 7/2015 | Liu et al. | |
| 9,570,340 B2 | 2/2017 | Grenouillet et al. | |
| 10,761,334 B2 * | 9/2020 | Evans | G02B 5/1842 |
| 2002/0122255 A1 | 9/2002 | Ogusu et al. | |
| 2002/0127497 A1 | 9/2002 | Brown et al. | |
| 2005/0130072 A1 * | 6/2005 | Koeda | G02B 5/1857 430/321 |
| 2005/0170655 A1 * | 8/2005 | Bencher | G03F 1/46 430/5 |
| 2007/0263973 A1 * | 11/2007 | Van Laere | G02B 6/124 385/129 |
| 2010/0053611 A1 | 3/2010 | Padmore et al. | |
| 2010/0079865 A1 | 4/2010 | Saarikko et al. | |
| 2010/0167186 A1 | 7/2010 | Jang et al. | |
| 2010/0214695 A1 * | 8/2010 | Isowaki | G11B 5/855 360/135 |
| 2011/0279818 A1 | 11/2011 | Amako et al. | |
| 2012/0228656 A1 * | 9/2012 | Kamiyama | H01L 33/10 257/98 |
| 2013/0320355 A1 * | 12/2013 | Xie | H01L 33/20 257/76 |
| 2014/0353141 A1 | 12/2014 | Liu et al. | |
| 2015/0325410 A1 * | 11/2015 | Godet | H01J 37/32357 204/192.33 |
| 2017/0031171 A1 | 2/2017 | Vallius et al. | |
| 2018/0005830 A1 * | 1/2018 | Laven | H01L 29/7813 |
| 2018/0059297 A1 | 3/2018 | Peroz et al. | |
| 2019/0227316 A1 * | 7/2019 | Lee | G02B 27/0081 |
| 2019/0258008 A1 * | 8/2019 | Hautala | G02B 6/34 |
| 2020/0018981 A1 * | 1/2020 | Evans | G02B 27/0944 |
| 2020/0249386 A1 * | 8/2020 | Mohanty | G02B 5/1857 |

FOREIGN PATENT DOCUMENTS

| | | | |
|---|---|---|---|
| JP | 62-299033 | * | 12/1987 |
| JP | 01-009683 | * | 1/1989 |
| JP | 01-018227 | * | 1/1989 |
| JP | 01-231327 | * | 9/1989 |
| JP | 03-235331 | * | 10/1991 |
| JP | 07-288247 | * | 10/1995 |
| JP | 2003264171 A | | 9/2003 |

OTHER PUBLICATIONS

Machine translation of JP 01-009683 (1989).*
Machine translationof JP 60-033502 (1985).*
IBM Tech. Discl. Bull., NA 9001155 (Jan. 1990).*
Machine translation of JP 60-033504 (1985).*
Machine translation of JP 07-288247 (Oct. 1995).*
International Search Report and Written Opinion for the International Patent Application No. PCT/US2019/051644, dated Mar. 24, 2020, 9 pages.
International Search Report and Written Opinion dated Oct. 18, 2019 for PCT/US2019/039382 filed Jun. 27, 2019, 9 pages.
International Search Report and Written Opinion dated Oct. 18, 2019 for PCT/US2019/039384 filed Jun. 27, 2019, 9 pages.

* cited by examiner

TECHNIQUES FOR FORMING ANGLED STRUCTURES

FIELD

This disclosure relates to optical elements, and more particularly to approaches for forming variable gratings in optical lenses.

BACKGROUND

Angled structures may be formed in substrates using a variety of etching and lithography approaches and for a variety of applications. Optical lenses have long been used to manipulate light for various advantages. Recently, microdiffraction gratings have been utilized in holographic and augmented/virtual reality (AR & VR) devices. Angled gratings may be formed on a substrate by generating an array of angled features within a grating layer at a non-zero angle with respect to a perpendicular to the substrate main surface, such as a substrate plane. The gratings may be formed by using directional ions to etch a grating layer with a mask disposed on the grating layer, where the mask has an array of features to define the spacing and width of angled structures. When etching the angled structures within a substrate layer, the sidewalls of the angled structures may change inclination as etching proceeds deeper into the substrate layer, leading to a non-ideal shape. In addition, because of shadowing of ions by the mask features, the width of trenches defining the substrate structures may be less than desired.

Therefore, with respect to at least the above considerations the present disclosure is provided.

BRIEF SUMMARY

In various embodiments, techniques for forming angled structures in a substrate are provided. According to one embodiment, a method of forming angled structures in a substrate may include forming a mask by etching angled mask features in a mask layer, disposed on a substrate base of the substrate. The angled mask features may have sidewalls, oriented at a non-zero angle of inclination with respect to perpendicular to a main surface of the substrate. The method may include etching the substrate with the mask in place, the etching comprising directing ions having trajectories arranged at a non-zero angle of incidence with respect to a perpendicular to the main surface.

In another embodiment, a method of forming an optical grating may include providing a substrate, the substrate comprising a grating layer; depositing a mask layer on the substrate; forming a mask by etching angled mask features in the mask layer. The angled mask features may have sidewalls, oriented at a non-zero angle of inclination with respect to perpendicular to a main surface of the substrate. The method may include etching the grating layer with the mask in place, the etching comprising directing ions having trajectories arranged at a non-zero angle of incidence with respect to a perpendicular to the main surface, and parallel to the non-zero angle of inclination.

In another embodiment, a method of forming angled structures in a substrate may include providing a substrate, depositing a mask layer on the substrate, and depositing a mask forming layer on an outer surface of the mask layer. The method may include etching angled mask features in the mask layer, with the mask forming layer in place and removing the mask forming layer from the outer surface of the mask layer. The method may also include, after the removing the mask forming layer, etching the substrate with the mask in place, the etching comprising directing ions having trajectories arranged at a non-zero angle of incidence with respect to a perpendicular to a main surface of the substrate.

BRIEF DESCRIPTION OF THE DRAWINGS

The accompanying drawings illustrate exemplary approaches of the disclosure, including the practical application of the principles thereof, as follows.

Figure 1A:
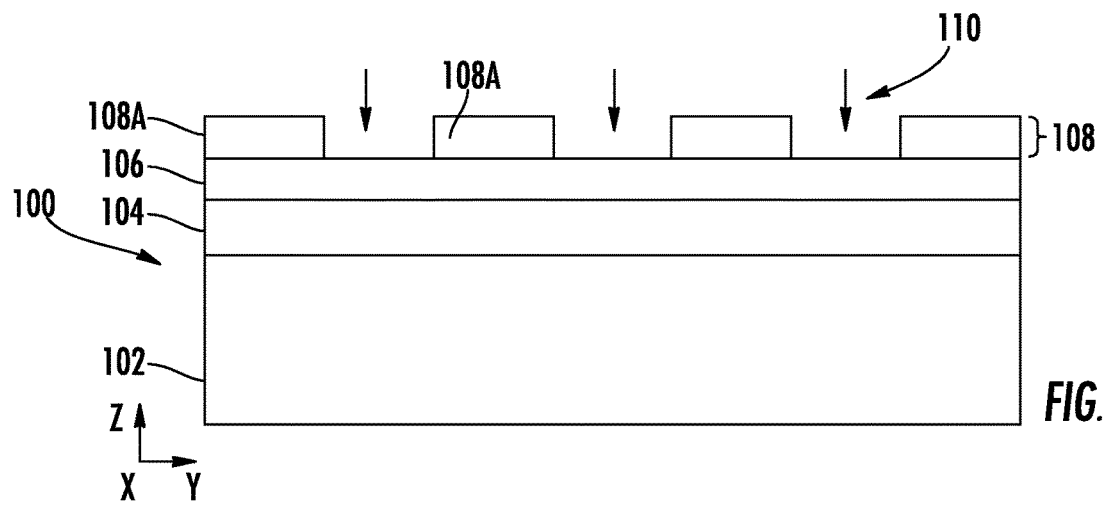
FIG. 1A-1H depict various stages in fabrication of a component having angled structures, according to some embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

As used herein, an element or operation recited in the singular and proceeded with the word "a" or "an" are understood as possibly including plural elements or operations, except as otherwise indicated. Furthermore, references to "one embodiment" or "some embodiments" of the present disclosure may be interpreted as including the existence of additional embodiments also incorporating the recited features.

Embodiments herein provide novel methods for forming angled structures in a substrate, including forming optical gratings.

Turning now to FIGS. 1A-1H there is shown a side cross-sectional view of a substrate 100, at different instances during fabrication of angled structures, according to embodiments of the disclosure. In various non-limiting embodiments, the angled structures as described herein may represent angled trenches, angled vias, angled gratings, such as optical gratings, or other angled features. In FIG. 1A, the substrate 100 includes a substrate base 102, a mask layer 104, disposed on the substrate base 102, a mask forming layer 106, disposed on the mask layer 104, and a patterning layer 108, disposed on the mask forming layer 106. In some embodiments the mask layer 104 may be a hard mask material, such as silicon nitride, titanium nitride, or may be a combination of layers. In some embodiments, the substrate base 102 may be formed of one layer or a plurality of layers, such as silicon oxide, silicon nitride, silicon, or other material. The embodiments are not limited in this context.

According to various embodiments, the mask forming layer 106 may be any suitable material, generally different from the mask layer 104. As an example where the mask layer 104 is a nitride, the mask forming layer may be silicon oxide ($SiO_2$). The patterning layer 108 may be formed of a suitable material, such as photoresist. As such the patterning layer 108 may be patterned using known techniques, such as photolithography, into patterning features 108A, as shown, which features serve to pattern the mask forming layer 106, subjacent the patterning layer 108. In the instance of FIG. 1A, etchant 110 is directed to the substrate 100, and may impact the mask forming layer 106 to etch the mask forming layer 106 in openings in the patterning layer 108. The etchant 110 may be a known reactive ion etching gas mixture, to selectively and directionally etch the mask forming layer 106 along the Z-axis.

Figure 1B:
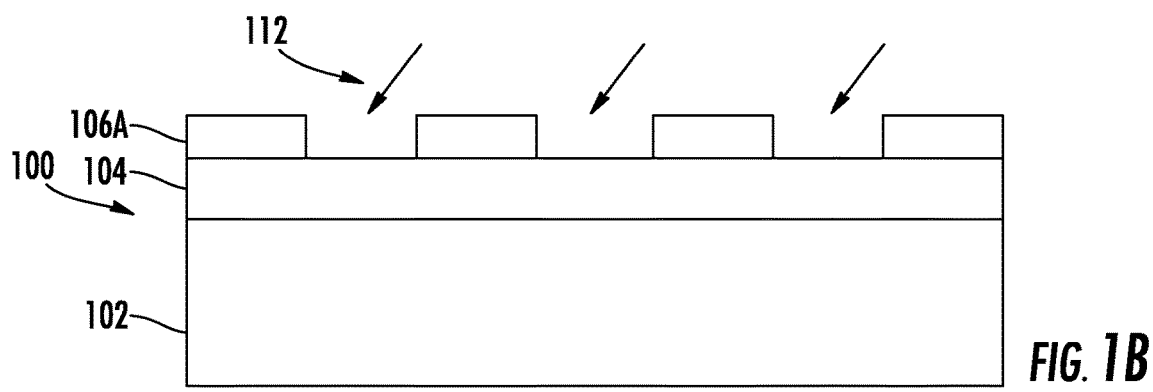

Turning to FIG. 1B, there is shown a subsequent instance after the mask forming layer 106 has been patterned according to the process of FIG. 1A, forming an array of patterning features in the mask forming layer 106. The patterning layer 108 has been removed, leaving the array of features, shown as mask forming features 106A, disposed over the mask layer 104. In the instance of FIG. 1B, an angled etch is performed, to pattern angled features within the mask layer 104. The mask forming features 106A may have generally vertical sidewalls, oriented along the Z-axis. In FIG. 1B, angled etching ions 112 are directed to openings in the mask forming layer 106, where the angled etching ions 112 strike the mask layer 104, as shown. In some embodiments, the angled etching ions 112 may be provided in a known reactive ion etching gas mixture to selectively etch the mask layer 104 with respect to the mask forming layer 106, and may be additionally selective with respect to the substrate base 102. Merely for the purposes of illustration, when the mask forming layer 106 is $SiO_2$ and the mask layer is TiN, a $Cl_2$/Ar plasma may be used to form the angled etching ions 112, to selectively etch the TiN mask. If the mask forming layer 106 is $SiO_2$ and the mask layer is SiN, a $CHF_3/O_2$ plasma may be used to generate the angled etching ions 112. The embodiments are not limited in this context.

Figure 1C:
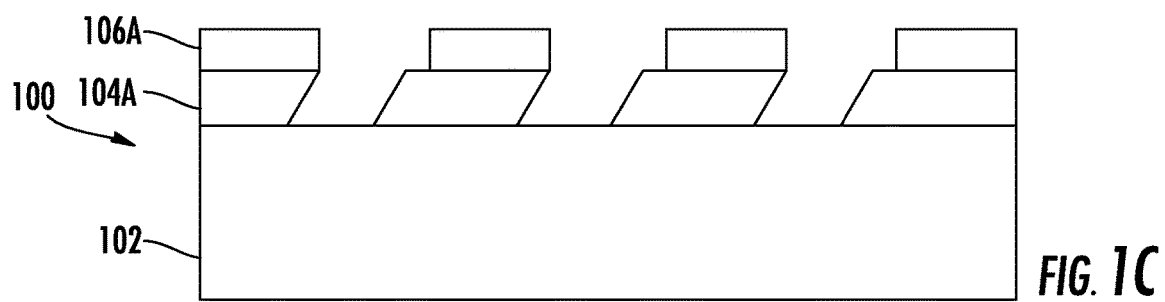

Turning to FIG. 1C there is shown a subsequent instance after the completion of the etching of the mask layer 104. As such, angled mask features 104A are formed, disposed on the substrate base 102. The angled mask features 104A exhibit a set of sidewalls disposed at a non-zero angle of inclination with respect to the perpendicular (Z-axis) to the main surface of the substrate 100 (defined by a plane parallel to the X-Y plane). In various non-limiting embodiments, the angled mask features 104A may have widths along the Y-axis of 50 nm, 100 nm, 500 nm, 1000 nm. Suitable widths for optical grating formation may be in the range of 250 nm to 750 nm. The embodiments are not limited in this context. Suitable height of the angled mask features 104A may be 25 nm, 50 nm, 100 nm or thicker. In some embodiments where the mask layer 104 is to be employed as a mask for sputter etching the thickness of the angled mask features 104A may be even greater, such as 200 nm, 500 nm or 1000 nm. The embodiments are not limited in this context.

Figure 1D:
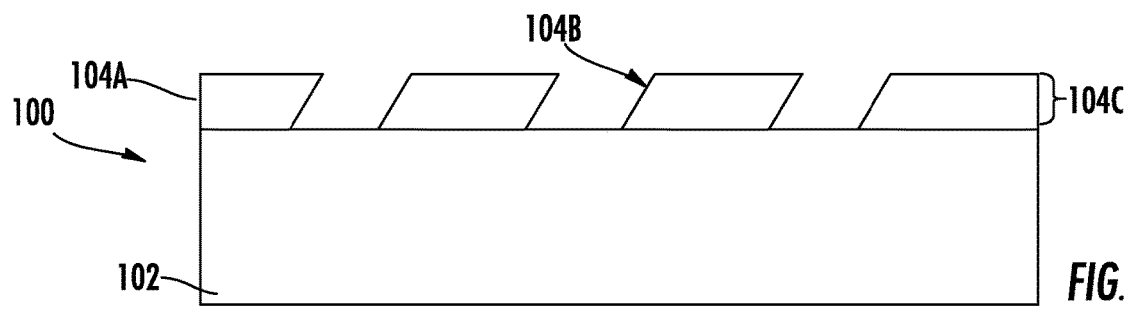

As such, the structure of FIG. 1C may be used to etch angled structures in the substrate base 102. Notably, the sidewalls of the mask forming layer 106 are oriented at a different angle than the sidewalls of the mask layer 104. In accordance with various embodiments of the disclosure, the mask forming layer 106 may be removed before etching the substrate base 102. Turning to FIG. 1D there is shown a subsequent instance after the removal of the mask forming layer 106, and before the etching of the substrate base 102. In this configuration, a layer having angled mask features 104A is disposed directly on the substrate base 102, while no other structures are present above the angled mask features 104A. As such, the sidewalls 104B of the angled mask features 104A extend from the outer surface of the substrate base 102 to the outer surface of the structure of FIG. 1D.

Figure 1E:
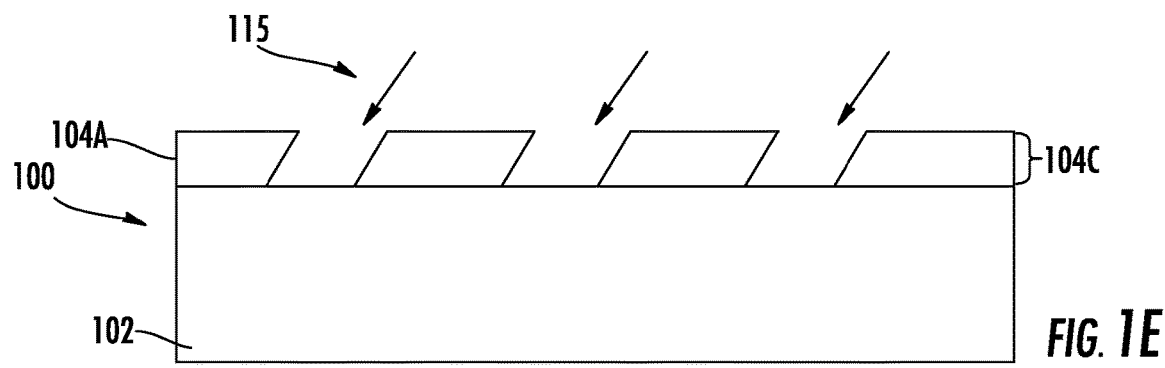
Figure 1F:
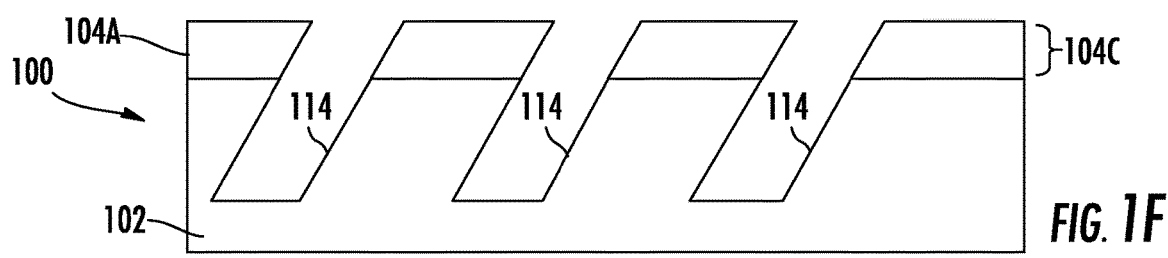

Turning to FIG. 1E, a subsequent instance is shown where the etching of the substrate, meaning the substrate base 102, is performed with the mask 104C in place. The etching is accomplished by directing angled ions 115 having trajectories arranged at a non-zero angle of incidence with respect to the perpendicular (Z-axis) to the main surface. As such, the trajectories of the angled ions 115 may be more aligned with the sidewalls 104B than ions directed along the perpendicular. According to various embodiments, the angled ions 115 may be directed to have trajectories parallel to the non-zero angle of inclination of the sidewalls 104B of angled mask features 104A. For example, if sidewalls 104B are oriented at 30 degrees with respect to perpendicular, the angled ions 115 may be directed with trajectories forming an angle of 30 degrees with respect to perpendicular. In this manner, the angled ions 115 may not strike the sidewalls 104B during the etching of the substrate base 102. Accordingly, the angled ions 115 may strike horizontal surfaces (parallel to the X-Y plane) while avoiding striking other surfaces of the mask 104C. In this sense the mask 104C may not shadow the angled ions 115, allowing the spacing, and angle of the angled mask features 104A to be replicated in the substrate base 102.

In other embodiments, while not strictly parallel, the angled ions 115 may form a collimated beam of ions having trajectories having an angle of incidence within +/−5 degrees of parallel with respect to the angle of inclination of the sidewalls 104B, or within +/−10 degrees of parallel with respect to the angle of inclination of the sidewalls 104B. Moreover, in some embodiments, the angled ions 115 may have trajectories distributed over a distribution of angles of incidence, or angular range, such as over an angular range of 10 degrees, 20 degrees, or 30 degrees, where the average or median trajectory (or mode trajectory) is parallel to the angle of inclination of the sidewalls 104B. In still further embodiments, the angled etching ions 112 may define an angular range of trajectories, such as 10 degrees, where the average or median trajectory is +5 degrees with respect to the angle of inclination of the sidewalls 104B. The embodiments are not limited in this context.

In these different geometries where the trajectories of the angled ions match the angle of inclination of the sidewalls 104B or are within 10 degrees or so of the angle of inclination of the sidewalls 104B, the etch geometry will tend to remain the same or nearly the same as the mask 104C erodes. Said differently, because the trajectories of angled ions 115 are aligned parallel or nearly parallel to the angle of the sidewalls 104B, shadowing of the angled ions 115 is minimized or eliminated, so the angled etching ions 112 "see" the same portions of the mask 104C and substrate base 102 at different instances during etching.

Turning to 1F there is shown a subsequent instance after the etching of the substrate base 102 by the angled ions 115 is complete. As shown an array of features, such as angled structures 114, having angled sidewalls, are formed in the substrate base 102.

Figure 1G:
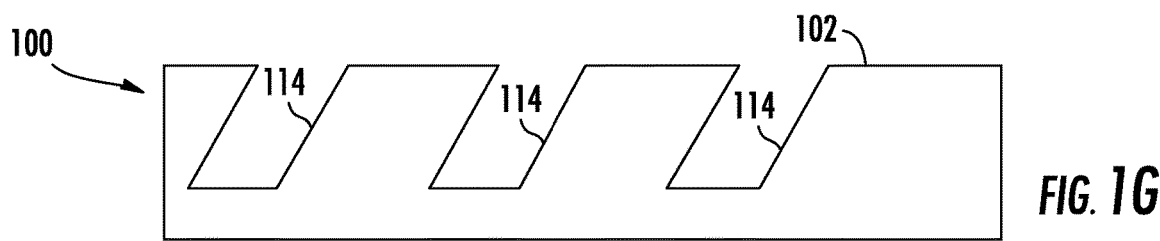

Turning to FIG. 1G, there is shown a subsequent instance after the removal of the mask 104C. At FIG. 1H there is shown a further instance after the instance of FIG. 1G, where the substrate base 102 is disposed on a subjacent layer 116. In some instances, the subjacent layer 116 may be another substrate, where the substrate base 102, such as an optical grating, is placed on the subjacent layer 116. In other embodiments, the subjacent layer 116 may be provided in the substrate 100 underneath the substrate base 102 before the processing of FIGS. 1A-1G. As such, the substrate 100 at the stage of FIG. 1H may represent an optical grating device, where the substrate base 102 represents an optical grating layer. Notably, while the substrate base 102 may be a single layer, the substrate base 102 may represent a plurality of layers in other embodiments, composed of different materials. FIG. 1I shows an embodiment where the substrate base 102 includes a layer 102A and a layer 102B. As such, the angled ions 115 may etch a continuous angled structure, shown as angled structures 117, extending through the layer 102A, as well as layer 102B. In some embodiments, such as when the composition of the layer 102A is substantially different from the composition of layer 102B, the composition of angled ions 115 may be adjusted between a first operation to etch the layer 102A, and a second operation to etch the layer 102B.

Figure 2:
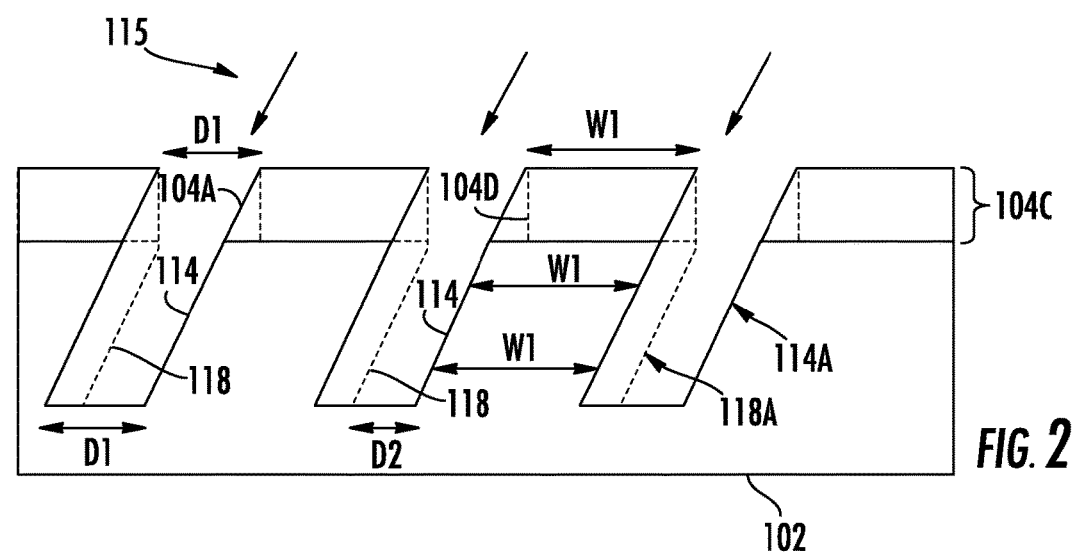
FIG. 2 illustrates details of the geometry of forming angled structures, using an angled mask, according to embodiments of the disclosure.

FIG. 2 illustrates details of the geometry of forming angled structures 114, using an angled mask, according to embodiments of the disclosure. In FIG. 2, the mask 104C is shown, together with a known structure of a mask for forming angled gratings, shown as mask features 104D (in dashes). The mask features 104D have generally vertical sidewalls, oriented parallel to the Z-axis. FIG. 2 depicts the geometry of angled structures formed using the angled ions 112, discussed above, including angled structures formed by the angled mask features 104A and angled gratings formed by the known mask features, that is, mask features 104D.

Figure 1H:
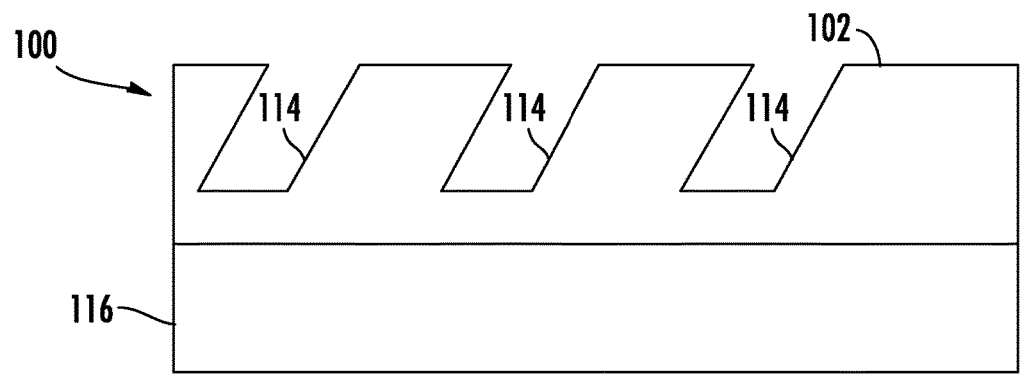
Figure 1I:
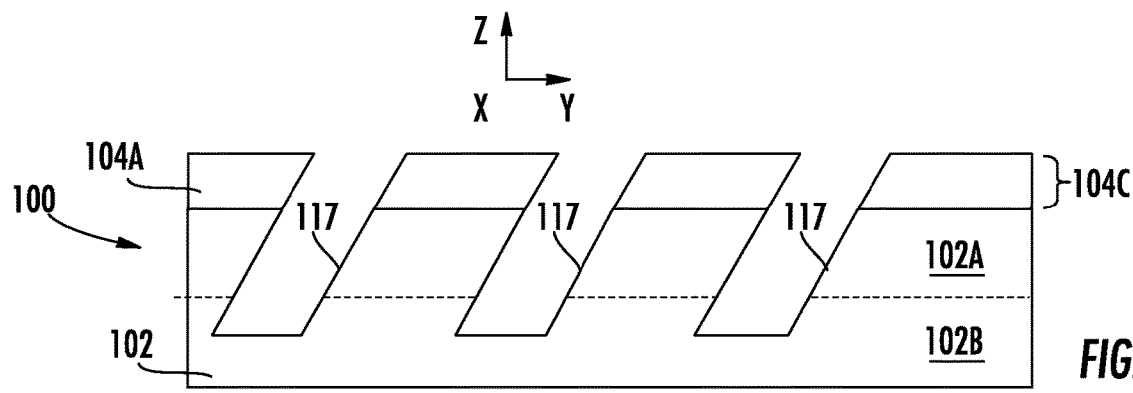
FIG. 1I depicts a variant of the structure of FIG. 1F.

The angled structures 114 shown in FIG. 2 are the same as the angled structures in FIG. 1H. Notably, because the angled etching ions 112 travel parallel to the sidewalls 114A, the first spacing between adjacent features of the angled mask features 104A (shown as D1) may be the same as the width of a trench between adjacent structures of the angled structures 114, also shown as D1. Said differently, the spacing defined by the mask 104C is preserved in the spacing between angled structures 114. This preservation of the spacing also means the width W1 of the angled mask features 104A may be the same as the width of the angled structures 114 and may remain constant as a function of depth.

As further shown in FIG. 2, when the rectangular mask features are used to form angled structures, meaning the mask features 104D, the resulting angled structures, shown as angled structures 118 are separated by a narrower set of trenches, shown by the spacing D2. This narrower spacing is the result of shadowing of the angled ions 115 by the mask features 104D. As a result, the angled structures 118 are wider than the mask features 104D along the Y-axis. Thus, the use of the angled mask features may preserve the lateral dimensions (in the X-y plane) of the mask used to generate angled structures in a subjacent substrate layer. Another aspect of using the mask features 104D is the change in shadowing taking place during etching of a layer, such as the substrate base 102. As the mask features 104D erode in height along the Z-axis, the shadowing of the angled etching ions 112 will change so the actual inclination of the sidewalls 118A will not remain at a constant angle, causing the sidewalls to converge.

Figure 3A:
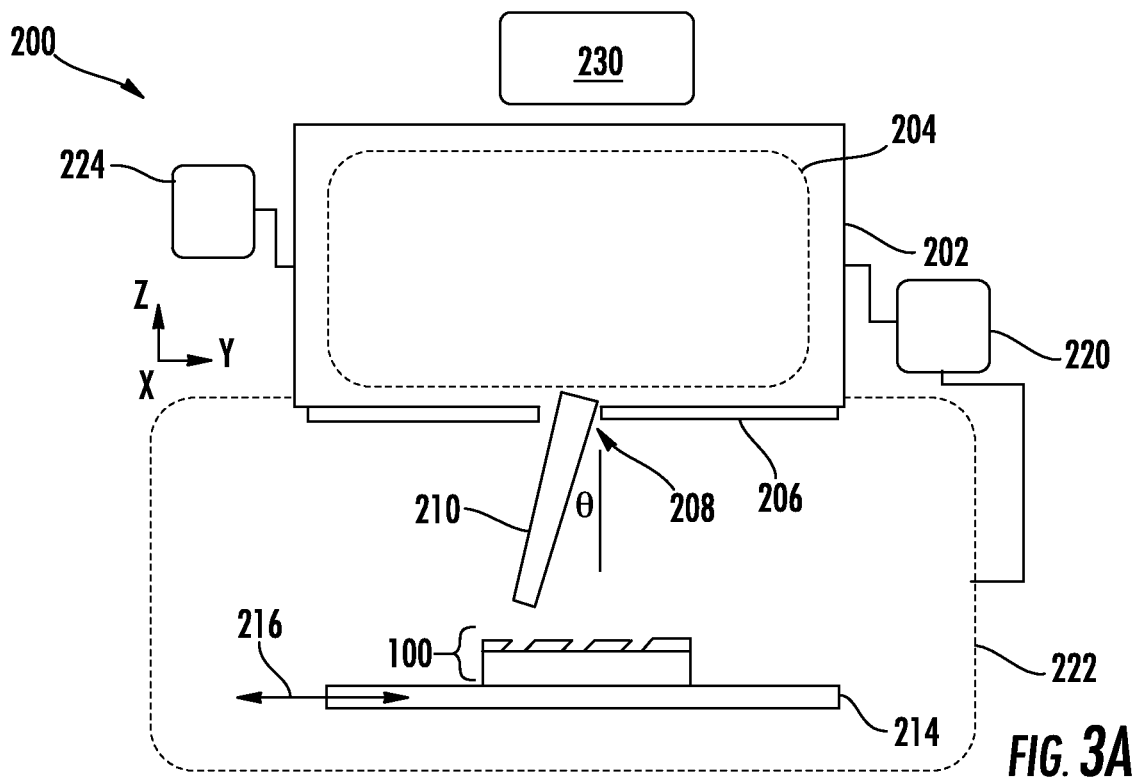
FIG. 3A and FIG. 3B show a side view and a top view, respectively, of a processing apparatus according to embodiments of the disclosure.

Turning now to FIG. 3A, there is shown a processing apparatus 200, depicted in schematic form. The processing apparatus 200 represents a processing apparatus for selectively etching portions of a substrate, such as sidewalls. The processing apparatus 200 may be a plasma-based processing system having a plasma chamber 202 for generating a plasma 204 therein by any convenient method as known in the art. The processing apparatus 200 may include a power supply 230 and a gas supply 224. An extraction plate 206 may be provided as shown, having an extraction aperture 208, where a selective etching may be performed to selectively remove sidewall layers. A substrate, such as a substrate 100 having the aforementioned structure as shown at FIG. 1B, is disposed in the process chamber 222. A substrate plane of the substrate 100 is represented by the X-Y plane of the Cartesian coordinate system shown, while a perpendicular to the plane of the substrate 100 lies along the Z-axis (Z-direction).

During a directional etching operation, an angled ion beam 210 is extracted through the extraction aperture 208 as shown. The angled ion beam 210 may be extracted when a voltage difference is applied using bias supply 220 between the plasma chamber 202 and substrate 100 as in known systems. The bias supply 220 may be coupled to the process chamber 222, for example, where the process chamber 222 and substrate 100 are held at the same potential. In various embodiments, the angled ion beam 210 may be extracted as a continuous beam or as a pulsed ion beam as in known systems. For example, the bias supply 220 may be configured to supply a voltage difference between plasma chamber 202 and process chamber 222, as a pulsed DC voltage, where the voltage, pulse frequency, and duty cycle of the pulsed voltage may be independently adjusted from one another.

By scanning a substrate stage 214 including substrate 100 with respect to the extraction aperture 208, and thus with respect to the angled ion beam 210, along the scan direction 216, the angled ion beam 210 may etch targeted surfaces of structures, such as using mask 104C, discussed above. In various embodiments, the angled mask features 104A may be elongated to extend along the X-axis as shown, when such structures are oriented, for example, perpendicularly to the scan direction 216, as further shown in FIG. 3B. In various embodiments, for example, the angled ion beam 210 may be provided as a ribbon ion beam having a long axis extending along the X-direction of the Cartesian coordinate system shown in FIG. 3B. The substrate 100 may be arranged, for example, where the long axis of the ribbon beam is parallel to the long axis of the angled mask features 104A, and where the angle of inclination of the angled mask features 104A (with respect to the Z-axis) matches the angle of incidence of the angled ions of angled ion beam 210. In this manner, a series of elongated structures, shaped in cross-section as shown in FIG. 1H, may be generated. may be a gas manifold coupled to provide a plurality of different gases to the plasma chamber 202. In particular embodiments, the angled ion beam 210 and other reactive species may be provided as an etch recipe to the substrate 100 so as to perform an angled reactive ion etching of a substrate layer using an angled mask, as described above. The etch recipe may be selective with respect to the material of the mask 104C, as well as the substrate base 102, discussed above.

Figure 3B:
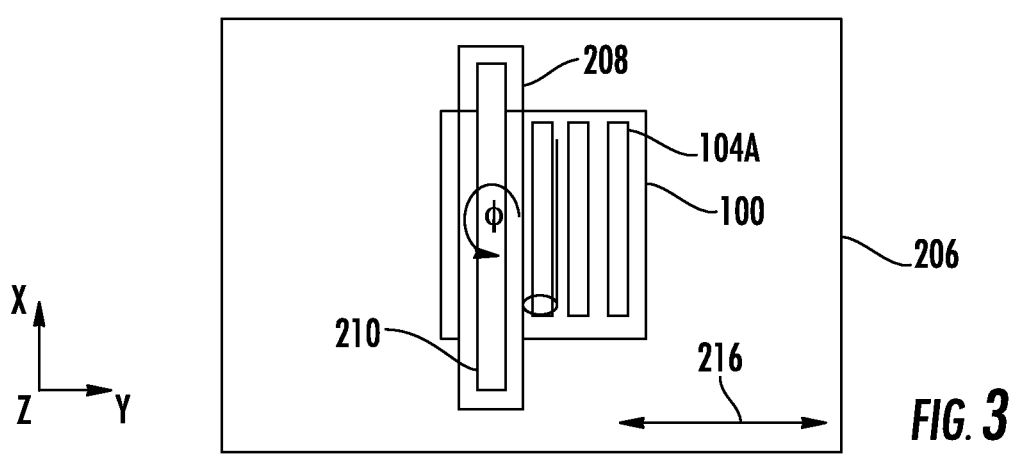

In the example of FIG. 3B, the angled ion beam 210 is provided as a ribbon ion beam extending to a beam width along the X-direction, where the beam width is adequate to expose an entire width of the substrate 100, even at the widest part along the X-direction. Exemplary beam widths may be in the range of 10 cm, 20 cm, 30 cm, or more while exemplary beam lengths along the Y-direction may be in the range of 3 mm, 5 mm, 10 mm, or 20 mm. The embodiments are not limited in this context.

As also indicated in FIG. 3B, the substrate 100 may be scanned in the scan direction 216, where the scan direction 216 lies in the X-Y plane, such as along the Y-direction. Notably, the scan direction 216 may represent the scanning of substrate 100 in two opposing (180 degrees) directions along the Y-direction, or just a scan toward the left or a scan toward the right. As shown in FIG. 3B, the long axis of angled ion beam 210 extends along the X-direction, perpendicularly to the scan direction 216. Accordingly, an entirety of the substrate 100 may be exposed to the angled ion beam 210 when scanning of the substrate 100 takes place along a scan direction 216 to an adequate length from a left side to right side of substrate 100 as shown in FIG. 3B.

Figure 4:
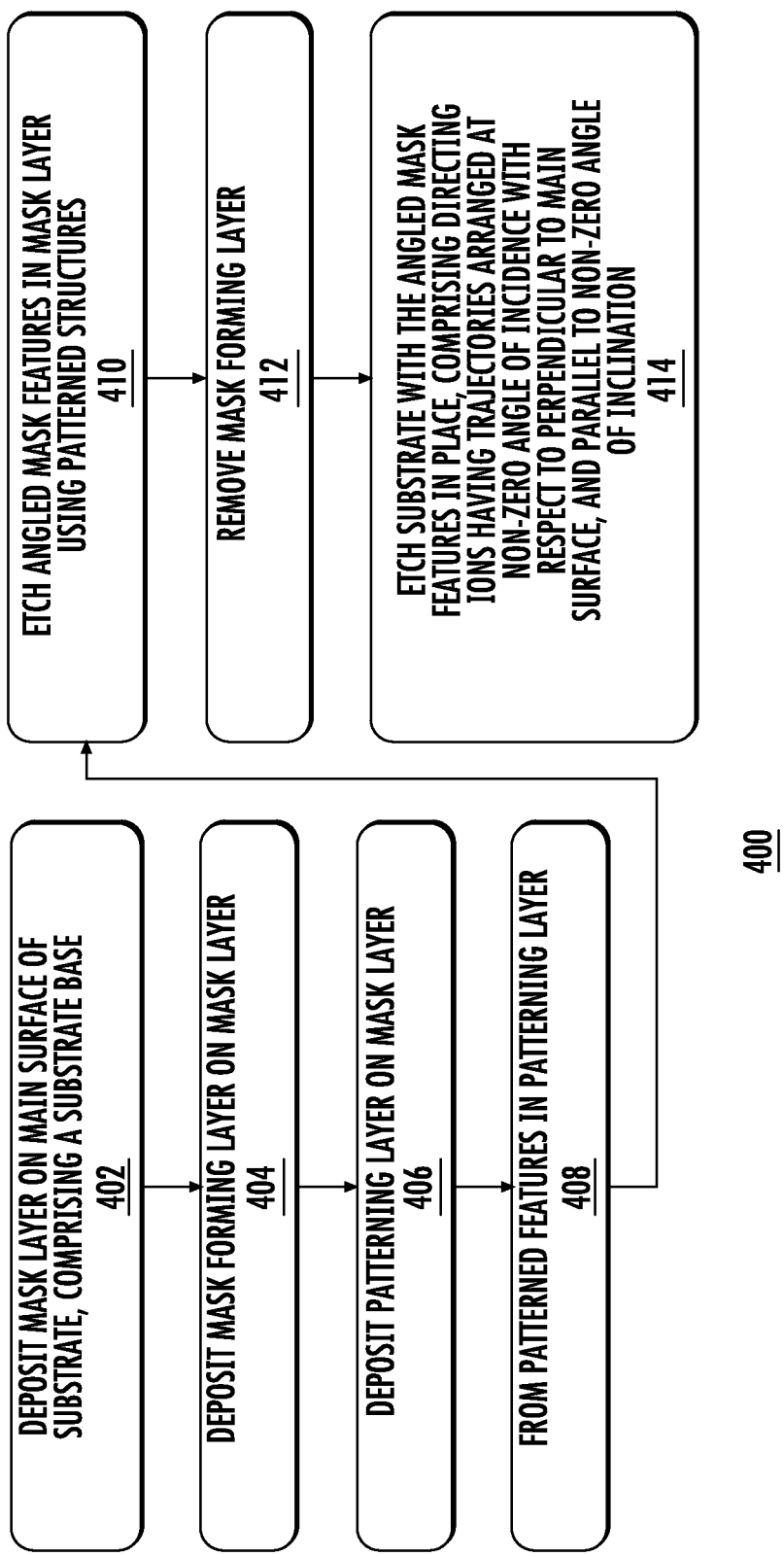
FIG. 4 depicts a process flow in accordance with embodiments of the disclosure.

Turning to FIG. 4, there is shown a process flow 400 according to various embodiments of the disclosure. At block 402, a mask layer is deposited on a substrate. The substrate may include a substrate base, where the mask layer is deposited directly on the substrate base. According to different embodiments, the substrate base may include one layer or a plurality of layers. In some examples, the mask layer may be a hard mask material including a nitride, an oxide, a carbon material, or other material. Generally, the material of the mask layer may differ from the material of the substrate base, directly subjacent the mask layer.

At block 404, a mask forming layer is deposited on the mask layer. The material of the mask forming layer may differ from the material of the mask layer, such as being an oxide, while the mask layer is a nitride. The embodiments are not limited in this context.

At block 406, a patterning layer is deposited on the mask forming layer, where the patterning layer is formed of a different material than the mask forming layer. As an example, the patterning layer may be a photoresist layer. The embodiments are not limited in this context.

At block 408, patterned features are formed in the patterning layer. The patterned features may be formed using known lithography techniques, for example. The patterned features may serve to pattern the mask forming layer, subjacent into patterning features.

At block 410, angled mask features are etched into the mask layer using the patterned features. The etching to form the angled mask features may be a reactive ion etching process. In some examples, the angled mask features may be formed by using reactive angled ions I a reactive angled ion beam etch process, such as using a ribbon beam to etch the angled mask features. According to some embodiments, the reactive ion etching gas mixture may selectively etch the mask layer with respect to the patterning layer and the substrate base, meaning the mask layer etches faster than layers above or below the mask layer. As such, the subjacent substrate base may be exposed between the angled mask features.

At block 412, the mask forming layer is removed.

At block 414, the substrate, such as the substrate base, is etched with the angled mask features in place. The etch may be performed by directing ions having trajectories arranged at a non-zero angle of incidence with respect to perpendicular to the main surface, meaning the trajectories span a range less than ninety degrees, such as 5 degrees to 75 degrees, with respect to the main surface. In some embodiments, the ions may be provided in a known reactive ion etching mixture suitable to preferentially etch the material of the substrate with respect to the angled mask features. In other embodiments, the ions may be provided as inert gas ions or other ions, where the ions etch the substrate by physical sputtering, in a non-reactive etch environment. As such, the ions may etch angled structures in the substrate, where the angled structures mimic the size and sidewall inclination of the angled mask features.

In sum, various embodiments described herein provide approaches for forming angled structures, such as optical gratings, vias, trenches or other structures in a substrate. The present embodiments provide various advantages over known approaches for forming angled features. For one advantage, the intended dimensions of the angled structures to be formed in a substrate may be more reliably preserved using a combination of angled mask features and angled ion etching aligned with the angled mask features. For another advantage, the present embodiments facilitate etching angled structures in hard-to-reactively-etch materials, since physical sputtering may be used in place of reactive ion etching. Since the trajectories of ions may be aligned parallel to the sidewalls of angled mask features, the trajectories of the ions may remain parallel to the sidewalls of the angled mask features as etching proceeds. Thus, the angled mask thickness may be increased without affecting the geometry of the etch, to prevent complete loss of the hardmask in cases where physical sputtering etches the hardmask at comparable rates to the etch rate of the substrate.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of forming angled structures in a substrate, comprising:

forming a first etch mask by etching angled mask features in a first etch mask layer, disposed on a substrate base of the substrate, the angled mask features having sidewalls, oriented at a non-zero angle of inclination with respect to perpendicular to a main surface of the substrate, wherein the first etch mask layer comprises a first hard mask material, the first hard mask material comprising an oxide or a nitride;

etching the substrate with the first etch mask in place, the etching comprising directing ions having trajectories arranged at a non-zero angle of incidence with respect to a perpendicular to the main surface; and removing the first etch mask after the etching the substrate, wherein the forming the first etch mask comprises:

depositing a second etch mask layer on the first etch mask layer before the etching the angled mask features, wherein the second etch mask layer comprises a second hard mask material, different from the first hard mask material;

etching the second etch mask layer with a patterning layer in place to form an array of patterning features in the second etch mask layer, having sidewalls oriented along the perpendicular to the main surface;

removing the patterning layer; and directing angled etching ions to openings in the second etch mask layer, wherein the angled mask features are formed in the first etch mask layer, using an ion beam having a rectangular cross-section that is wider than the substrate, wherein the second etch mask layer is removed before the etching the substrate.

2. The method of claim 1, wherein the angled mask features in the first etch mask layer define a first spacing, between adjacent features of the angled mask features, and wherein the angled structures define a width of a trench, between adjacent structures of the angled structures, the width being equal to the first spacing.

3. The method of claim 1, wherein the non-zero angle of incidence is parallel to the non-zero angle of inclination, wherein the angled structures comprise angled sidewalls, parallel to a set of sidewalls of the angled mask features of the mask layer.

4. The method of claim 1, wherein the etching the substrate comprises directing reactive angled ions in a reactive ion etch to the substrate, wherein the substrate is selectively etched with respect to the first etch mask layer.

5. The method of claim 1, wherein the etching the substrate comprises directing angled ions to sputter etch the substrate, in a non-reactive etching environment.

6. The method of claim 1, wherein the angled mask features are elongated to extend along a first direction, within the main surface of the substrate, and wherein the etching the substrate comprises directionally etching the substrate through the mask layer using an angled ion beam, wherein the angled ion beam comprises a ribbon beam, the ribbon beam having a long axis extending parallel to the first direction.

7. The method of claim 1, wherein the non-zero angle of incidence comprises a value between 5 degrees and 75 degrees.

8. A method of forming an optical grating, comprising:

providing a substrate, the substrate comprising a grating layer;

depositing a first etch mask layer comprising a first hard mask material on the substrate, the first hard mask material comprising an oxide or a nitride;

forming a first etch mask by etching angled mask features in the first etch mask layer, the angled mask features having sidewalls, oriented at a non-zero angle of inclination with respect to perpendicular to a main surface of the substrate; and etching the grating layer with the first etch mask in place, the etching comprising directing ions having trajectories arranged at a non-zero angle of incidence with respect to a perpendicular to the main surface, and parallel to the non-zero angle of inclination; and removing the first etch mask after the etching the substrate, wherein the forming the first etch mask comprises:

depositing a second etch mask layer on the first etch mask layer before the etching the angled mask features, wherein the second etch mask layer comprises a second hard mask material, different from the first hard mask material;

etching the second etch mask layer with a patterning layer in place to form an array of patterning features in the second etch mask layer, having sidewalls oriented along the perpendicular to the main surface;

removing the patterning layer; and directing angled etching ions to openings in the second etch mask layer, wherein the angled mask features are formed in the first etch mask layer, using an ion beam having a rectangular cross-section that is wider than the substrate, wherein the second etch mask layer is removed before the etching the substrate.

9. The method of claim 8, wherein the etching the grating layer generates a plurality of angled structures having angled sidewalls, the angled sidewalls being parallel to a set of sidewalls of the angled mask features of the first etch mask layer.

10. The method of claim 8, wherein the etching the substrate comprises directing reactive angled ions in a reactive ion etch to the substrate, wherein the substrate is selectively etched with respect to the first etch mask layer.

11. The method of claim 8, wherein the etching the substrate comprises directing angled ions to sputter etch the substrate, in a non-reactive etching environment.

12. A method of forming angled structures in a substrate, comprising:

providing a substrate;

depositing a first etch mask layer comprising a first hard mask material on the substrate, the first hard mask material comprising silicon nitride, titanium nitride, or an oxide;

depositing a second etch mask layer comprising a second hard mask material, different from the first hard mask material on an outer surface of the first etch mask layer;

etching the second etch mask layer with a patterning layer in place to form an array of patterning features in the second etch mask layer, having sidewalls oriented along the perpendicular to the main surface;

removing the patterning layer;

etching angled mask features in the first etch mask layer, with the second etch mask layer in place;

removing the second etch mask layer from the outer surface of the first etch mask layer; and after the removing the second etch mask layer, etching the substrate with the first etch mask in place, the etching comprising directing ions having trajectories arranged at a non-zero angle of incidence with respect to a perpendicular to a main surface of the substrate, using an ion beam having a rectangular cross-section that is wider than the substrate, wherein the second etch mask layer is removed before the etching the substrate.

13. The method of claim 12, wherein the etching the substrate generates angled sidewalls of the angled structures, the angled sidewalls being parallel to a set of sidewalls of the angled mask features of the first etch mask layer.

14. The method of claim 12, wherein the etching the substrate comprises directing reactive angled ions in a reactive ion etch to the substrate, wherein the substrate is selectively etched with respect to the first etch mask layer.

15. The method of claim 12, wherein the angled mask features are elongated to extend along a first direction, within the main surface of the substrate, and wherein the etching the substrate comprises directionally etching the substrate through the first etch mask layer using an angled ion beam, wherein the angled ion beam comprises a ribbon beam, the ribbon beam having a long axis extending parallel to the first direction.

* * * * *